United States Patent
Hosoda et al.

(10) Patent No.: US 7,173,262 B2
(45) Date of Patent: Feb. 6, 2007

(54) CHARGED PARTICLE BEAM EXPOSURE APPARATUS, CHARGED PARTICLE BEAM EXPOSURE METHOD AND DEVICE MANUFACTURING METHOD

(75) Inventors: Masaki Hosoda, Saitama (JP); Masato Muraki, Inagi (JP); Osamu Kamimura, Kokubunji (JP)

(73) Assignees: Canon Kabushiki Kaisha, Tokyo (JP); Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 11/159,356

(22) Filed: Jun. 23, 2005

(65) Prior Publication Data

US 2006/0017019 A1    Jan. 26, 2006

(30) Foreign Application Priority Data

Jun. 30, 2004    (JP) .............................. 2004-194775

(51) Int. Cl.
*G21K 5/10* (2006.01)
*H01K 1/62* (2006.01)
*H01J 37/302* (2006.01)

(52) U.S. Cl. .............................. 250/492.22; 250/492.2; 250/492.3; 250/492.23; 250/396 R

(58) Field of Classification Search ............ 250/492.22
See application file for complete search history.

(56) References Cited

U.S. PATENT DOCUMENTS 5,144,142 A * 9/1992 Fueki et al. ............ 250/396 R (Continued)

FOREIGN PATENT DOCUMENTS

EP    0 794 552 A2    9/1997

(Continued)

OTHER PUBLICATIONS

"Electron and Ion Beam Handbook," Japan Society for Promotion of Science, the 132 Meeting Edition, The Nikkan Kogyo Shimbun, Ltd., 1998, pp. 519-523, with English translation.

*Primary Examiner*—Nikita Wells
*Assistant Examiner*—Bernard Souw
(74) *Attorney, Agent, or Firm*—Fitzpatrick, Cella, Harper & Scinto

(57) ABSTRACT

A charged particle beam exposure apparatus for writing a desired pattern on a substrate using a charged particle beam. The apparatus includes a blanking unit, having a deflector capable of deflecting the charged particle beam in at least two directions, configured to control beam passage to the substrate by deflecting the charged particle beam, and a setting unit configured to set a deflection direction of the charged particle beam by the deflector.

17 Claims, 16 Drawing Sheets

U.S. PATENT DOCUMENTS

| | | | |
|---|---|---|---|
| 5,260,579 A * | 11/1993 | Yasuda et al. | 250/492.2 |
| 5,262,341 A * | 11/1993 | Fueki et al. | 438/618 |
| 5,650,631 A * | 7/1997 | Sohda et al. | 250/492.2 |
| 5,834,783 A | 11/1998 | Muraki et al. | 250/398 |
| 5,973,332 A | 10/1999 | Muraki et al. | 250/492.2 |
| 6,166,387 A | 12/2000 | Muraki et al. | 250/492.2 |
| 6,323,499 B1 | 11/2001 | Muraki et al. | 250/492.22 |
| 6,667,486 B2 * | 12/2003 | Ohta et al. | 250/492.22 |
| 6,809,319 B2 * | 10/2004 | Sohda et al. | 250/310 |
| 6,818,911 B2 * | 11/2004 | Tamamori et al. | 250/492.22 |
| 6,903,353 B2 * | 6/2005 | Muraki et al. | 250/492.22 |
| 7,049,607 B2 * | 5/2006 | Sohda et al. | 250/492.21 |
| 2003/0025088 A1 * | 2/2003 | Oae et al. | 250/492.23 |
| 2003/0189181 A1 * | 10/2003 | Ohta et al. | 250/492.22 |
| 2004/0188636 A1 * | 9/2004 | Hosoda et al. | 250/492.22 |
| 2005/0072941 A1 * | 4/2005 | Tanimoto et al. | 250/492.22 |
| 2006/0017019 A1 * | 1/2006 | Hosoda et al. | 250/492.22 |
| 2006/0197453 A1 * | 9/2006 | Nakayama et al. | 315/32 |

FOREIGN PATENT DOCUMENTS

| | | |
|---|---|---|
| EP | 1 369 897 A2 | 12/2003 |
| JP | 9-240143 | 9/1997 |
| JP | 9-245708 | 9/1997 |
| JP | 9-288991 | 11/1997 |
| JP | 9-330868 | 12/1997 |
| JP | 9-330870 | 12/1997 |

* cited by examiner

FIG. 12
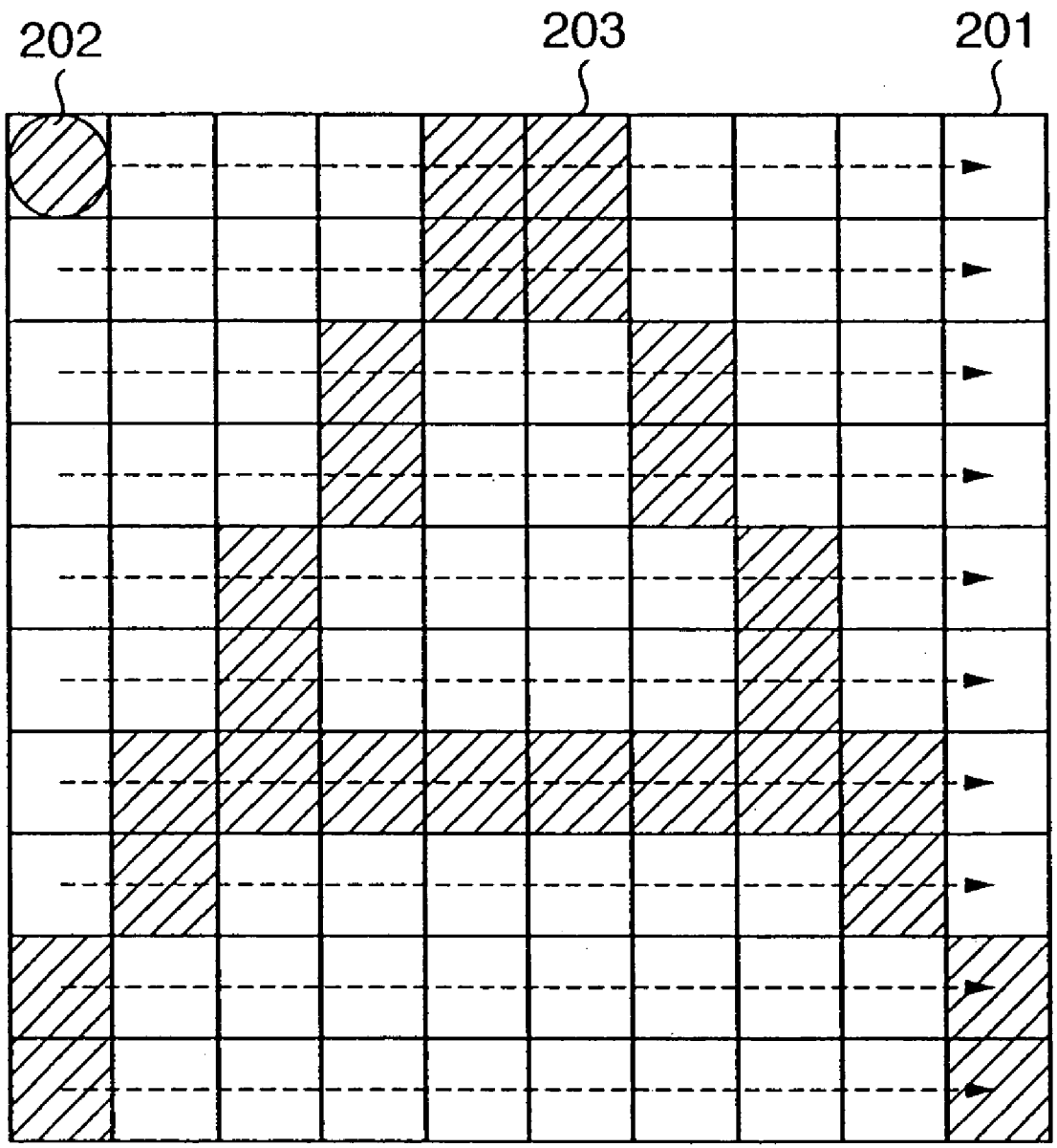
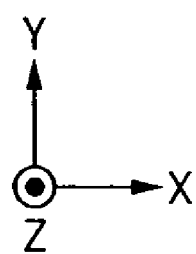

ELECTRON BEAM
PIXEL

CHARGED PARTICLE BEAM EXPOSURE APPARATUS, CHARGED PARTICLE BEAM EXPOSURE METHOD AND DEVICE MANUFACTURING METHOD

FIELD OF THE INVENTION

The present invention relates to a charged particle beam exposure apparatus and method for performing exposure using a charged particle beam, such as an electron beam or an ion beam, and, more particularly, to a charged particle beam exposure apparatus and method for performing drawing on a substrate while blanking a charged particle beam. The apparatus and method are mainly used for exposure of semiconductor integrated circuits, and the like.

BACKGROUND OF THE INVENTION

FIG. 11 shows a general raster-scan type electron-beam exposure apparatus.

An electron beam emitted from an electron source 101 forms an image 103 of the electron source 101 by an electromagnetic lens 102. The electron source image 103 is reduce-projected onto a wafer 109 via a reduced electron optical system including electromagnetic lenses 105 and 108. A blanker 104, which is an electrostatic deflector in the position of the electron source image 103, controls irradiation and blocking of an electron beam to the wafer 109. That is, when the electron beam is emitted to the wafer 109, the electron beam is emitted on the wafer 109 without the blanker 104. On the other hand, when the electron beam to the wafer 109 is blocked, the electron beam is deflected by using the blanker 104, and the electron beam is blocked by a blanking aperture 106 positioned above a pupil of the reduced electron optical system. Further, the electron beam is scanned by an electrostatic deflector 107.

Next, a method of drawing on the wafer 109 by raster scanning will be described with reference to FIG. 12. For example, when a pattern "A" is to be drawn, first, a drawing area is divided into plural pixels 201. Then, irradiation and blocking of an electron beam 202 is controlled while the electron beam 202 is scanned in a direction X by using an electrostatic deflector, thereby, the electron beam is emitted on only a pixel 203 corresponding to a pattern portion to be drawn. When the X-directional scanning has been completed, the electron beam 202 is stepped in a direction Y, then, similar X-directional scanning is performed. Thus, the entire pattern "A" is drawn. (See, for example, Japanese Patent Application Laid-Open No. Hei 09-245708 and "Electron and Ion beam Handbook", Japan Society for Promotion of Science, the 132nd Meeting Edition, The Nikkan Kogyo Shimbun, Ltd., page 519.)

However, when a pixel is exposed to a raster-scanned electron beam, the position of the electron beam in the pixel changes with time in the raster scanning direction (direction X), while it does not change with time in the direction vertical to the raster scanning direction (direction Y), as shown in FIG. 13A. That is, as shown in FIG. 13B, the beam current intensity distribution in the pixel in the raster scanning direction (direction X) is the moving average of the electron beam in the pixel. FIG. 13C shows the beam current intensity distribution in the pixel as a result. Accordingly, even in a case wherein the beam current intensity distribution is an axisymmetric Gauss distribution, when drawing is made by raster scanning, the beam current intensity distribution spreads in the raster scanning direction (direction X) as if the electron beam is defocused in that direction. Accordingly, desired pattern dimensional accuracy cannot be obtained without difficulty.

Further, in a case wherein the electron beam has astigmatism aberration or coma aberration due to influence of an electromagnetic lens, a deflector, or the like, and the beam current intensity distribution is not a Gaussian distribution, a desired pattern dimensional accuracy cannot be obtained without difficulty. This problem occurs regardless of raster scanning exposure.

SUMMARY OF THE INVENTION

The present invention has been made to address the problems in the above-described conventional art.

That is, the present invention has an object to reduce an adverse effect on drawing by moving a charged particle beam due to blanking as much as possible.

According to the present invention, there is provided a charged particle beam exposure apparatus for printing a desired pattern on a substrate using a charged particle beam, comprising:

a blanking unit, having a deflector capable of deflecting the charged particle beam in at least two directions, configured to control emission to the substrate by deflecting the charged particle beam; and a setting unit configured to set a deflection direction of the charged particle beam by the deflector.

Further, there is provided a charged particle beam exposure apparatus for printing a desired pattern on a substrate using plural charged particle beams, comprising:

a blanking array unit, having plural deflectors provided in correspondence with the respective charged particle beams, to deflect the charged particle beam into at least two directions, configured to control emission to the substrate by respectively deflecting the plural charged particle beams; and a setting unit configured to set a deflection direction of a charged particle beam, respectively, for the plural deflectors.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 12 is an explanatory view of the method of drawing on a wafer by raster scanning;

DETAILED DESCRIPTION OF THE PREFERRED EMBODIMENTS

Figure 1A:
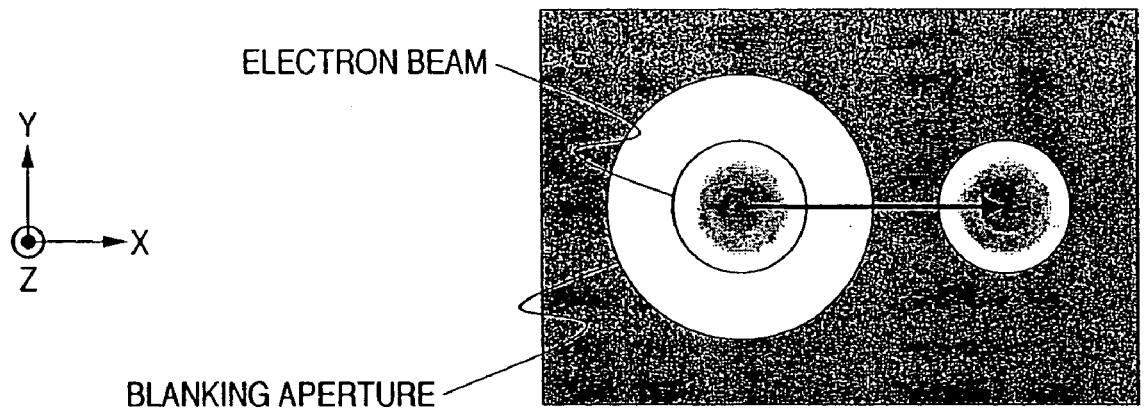
FIGS. 1A to 1C are an explanatory view and graphs showing spreading of the electron beam current intensity distribution in a blanking direction, according to a first embodiment of the present invention.

Preferred embodiments of the present invention will now be described in detail in accordance with the accompanying drawings.

In the embodiments, as examples of a charged particle beam exposure apparatus, (1) an electron beam exposure apparatus, which performs blanking in a direction vertical to a raster scanning direction (hereinbelow, a direction in which an electron beam is deflected for blanking will be referred to as a "blanking direction"), (2) an electron beam exposure apparatus, which performs blanking in a direction where a beam diameter is the shortest (a single electron beam is used), and (3) an electron beam exposure apparatus which performs blanking in a direction where a beam diameter is the shortest (plural electron beams are used), will be described. Note that the present invention is also applicable to an exposure apparatus using an ion beam.

First Embodiment (1) An electron beam exposure apparatus which performs blanking in a direction vertical to a raster scanning direction.

In this apparatus, the drawing-pattern dimensional accuracy can be improved by blanking an electron beam in a direction vertical to a raster scanning direction.

First, the spreading of the electron beam current intensity distribution in a blanking direction will be described with reference to FIGS. 1A to 1C.

Figure 1B:
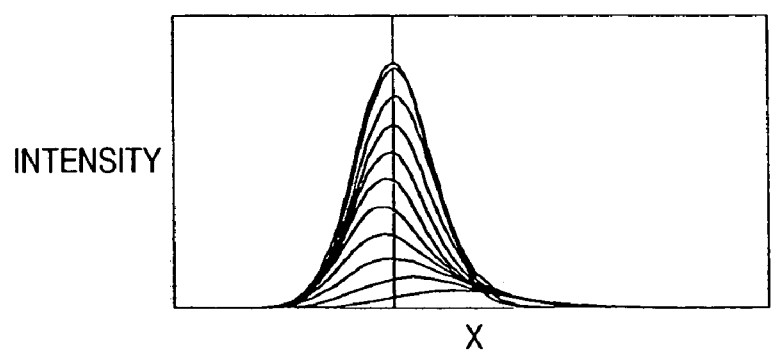
Figure 1C:
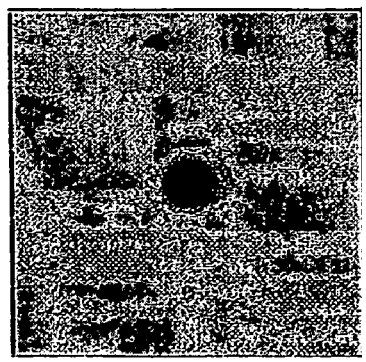

As shown in FIG. 1A, the blanking operation is changing a status where an electron beam is passing through a blanking aperture without actuating a blanker to a status where the blanker is actuated to move the electron beam in a direction X and the electron beam is blocked by the blanking aperture. At this time, the electron beam moves in the direction X in a predetermined transition time. As shown in FIG. 11B, the beam current intensity distribution on a wafer is the moving average of the electron beam when it is blocked by the blanking aperture. As a result, the beam current intensity distribution at the blanking transition process is as shown in FIG. 1C. Even if the intensity distribution of the electron beam is an axisymmetric Gaussian distribution, the beam current intensity distribution spreads in the blanking direction (direction X) at the blanking transition process as if the electron beam is defocused in that direction.

As described above, upon raster scanning, the electron beam is defocused in the raster scanning direction, and upon blanking, the electron beam is defocused in the blanking direction. Accordingly, the defocus of the electron beam in the raster scanning direction can be offset by blanking the electron beam in the direction vertical to the raster scanning direction, and the drawing pattern dimensional accuracy can be improved.

Figure 2A:
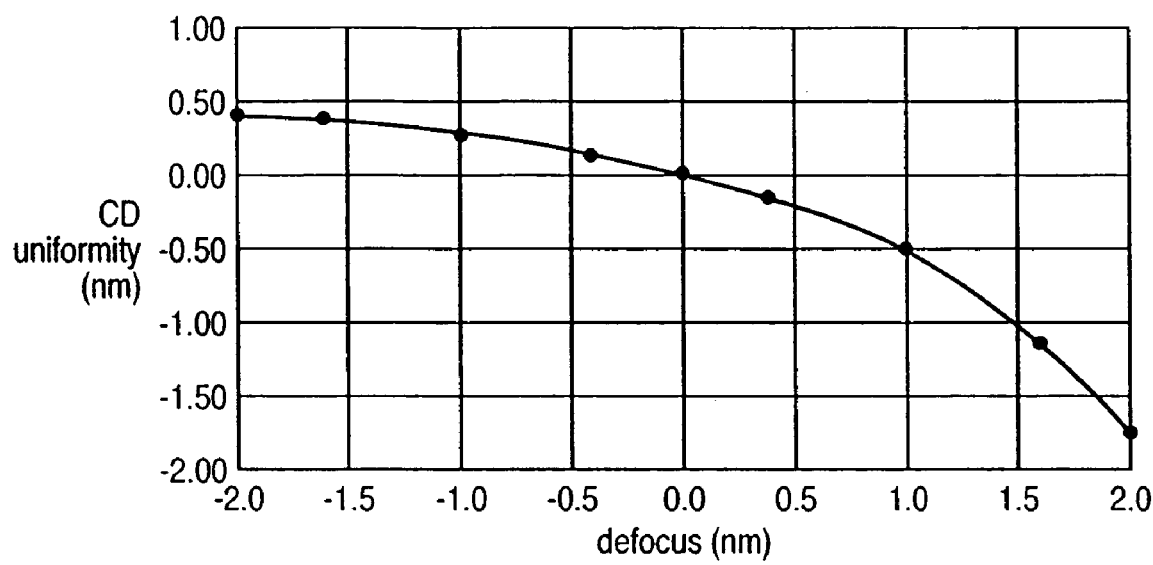
FIGS. 2A and 2B are graphs explaining that pattern dimensional accuracy can be improved by correcting a raster scanning direction and the blanking direction to directions orthogonal to each other according to the first embodiment.
Figure 2B:
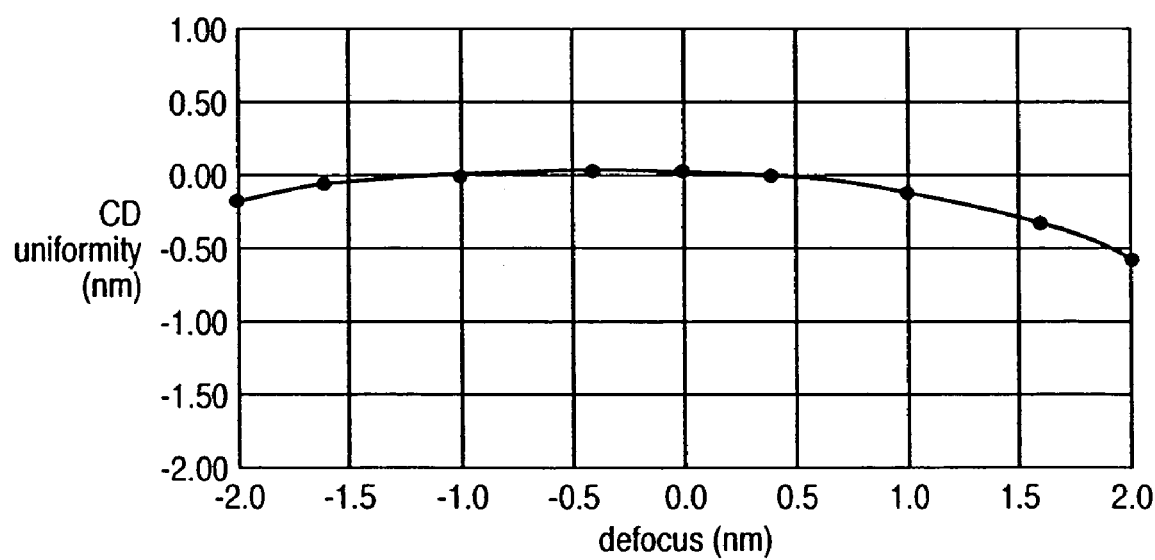

FIG. 2A shows a graph of pattern dimensional accuracy in a case wherein the raster scanning direction and the blanking direction are brought into correspondence. FIG. 2B shows a graph of pattern dimensional accuracy in a case wherein the raster scanning direction and the blanking direction are vertical to each other. FIGS. 2A and 2B are computed graphs in which a lateral axis indicates a focus shift amount, while a vertical axis indicates pattern dimensional accuracy. In a case wherein there is a +2 micron focus shift, it is understood that the pattern dimensional accuracy is improved more than three times.

That is, as the electron beam exposure apparatus, which exposes a substrate using blanking means, has a function of adjusting the blanking direction to a predetermined direction, the pattern dimensional accuracy can be improved.

Next, the construction and operation of the electron beam exposure apparatus according to the present embodiment will be described. As the construction of the electron beam exposure apparatus of the present embodiment is approximately the same as that shown in FIG. 11, the construction will be described by using FIG. 11. Note that the electrostatic deflector 107 is capable of deflecting the electron beam in the direction X and the direction Y in FIG. 11, and the scanning direction can be arbitrarily set to the direction X or the direction Y.

Figure 11:
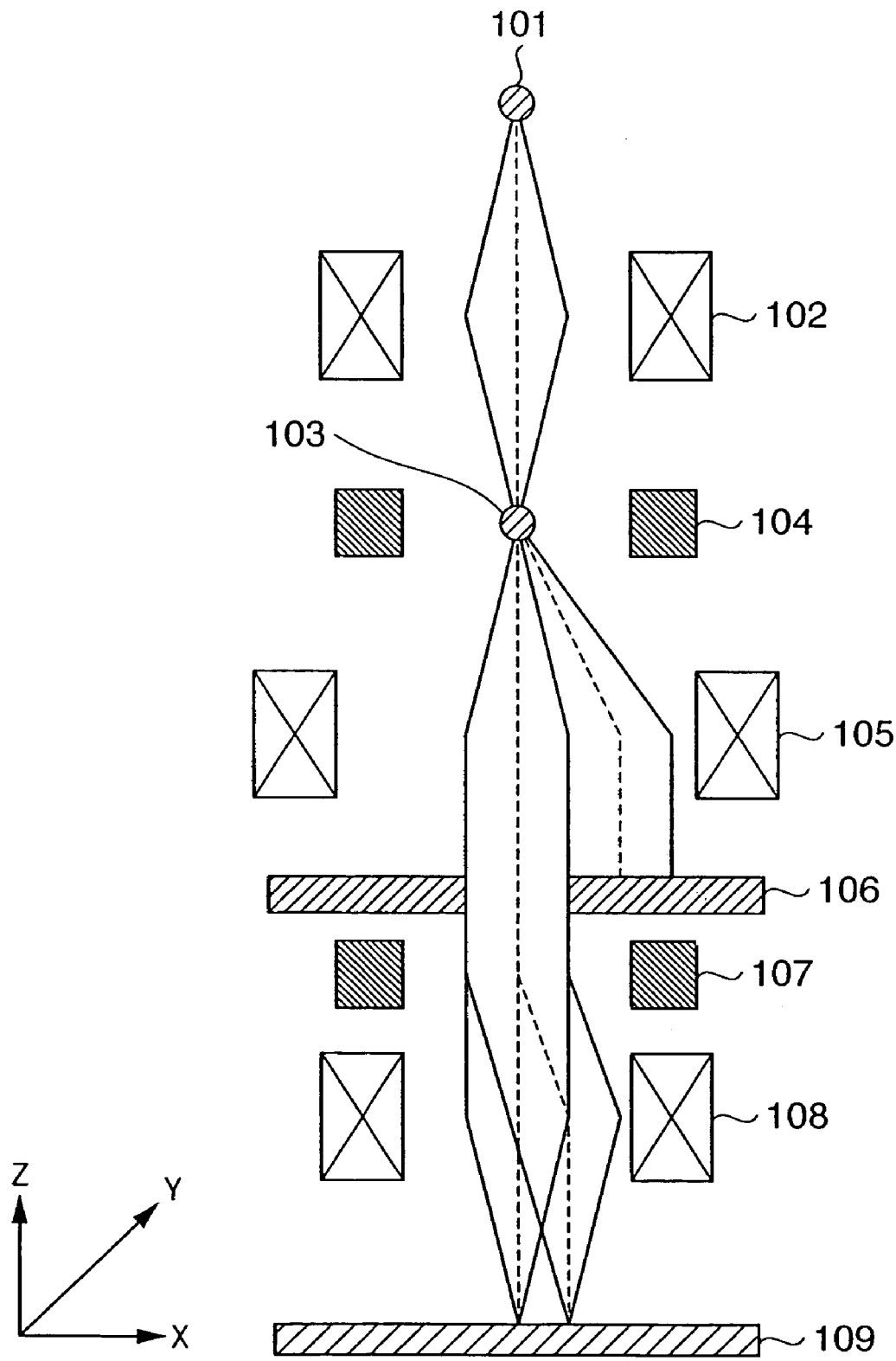
FIG. 11 is a substantial-part schematic cross-sectional view of a general raster scanning type electron-beam exposure apparatus.
Figure 13A:
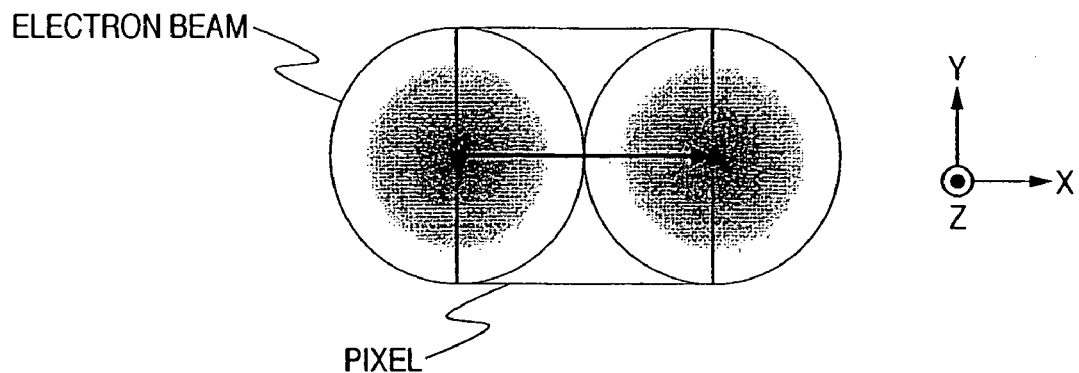
FIGS. 13A to 13C are an explanatory view and graphs showing spreading of the electron beam current intensity distribution in a raster scanning direction.
Figure 13B:
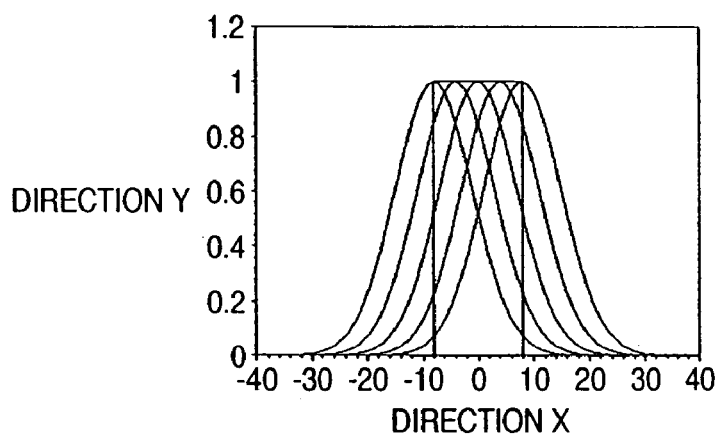
Figure 13C:
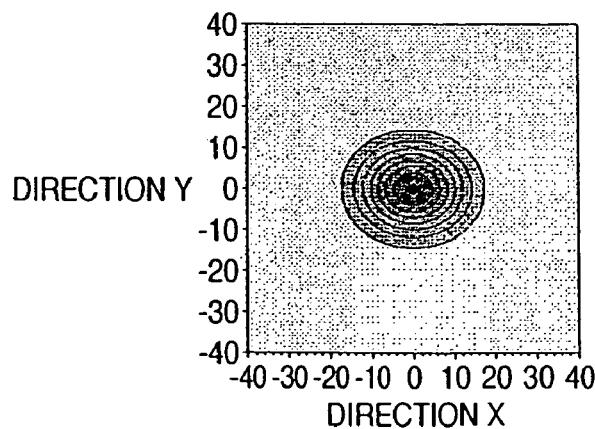
Figure 15:
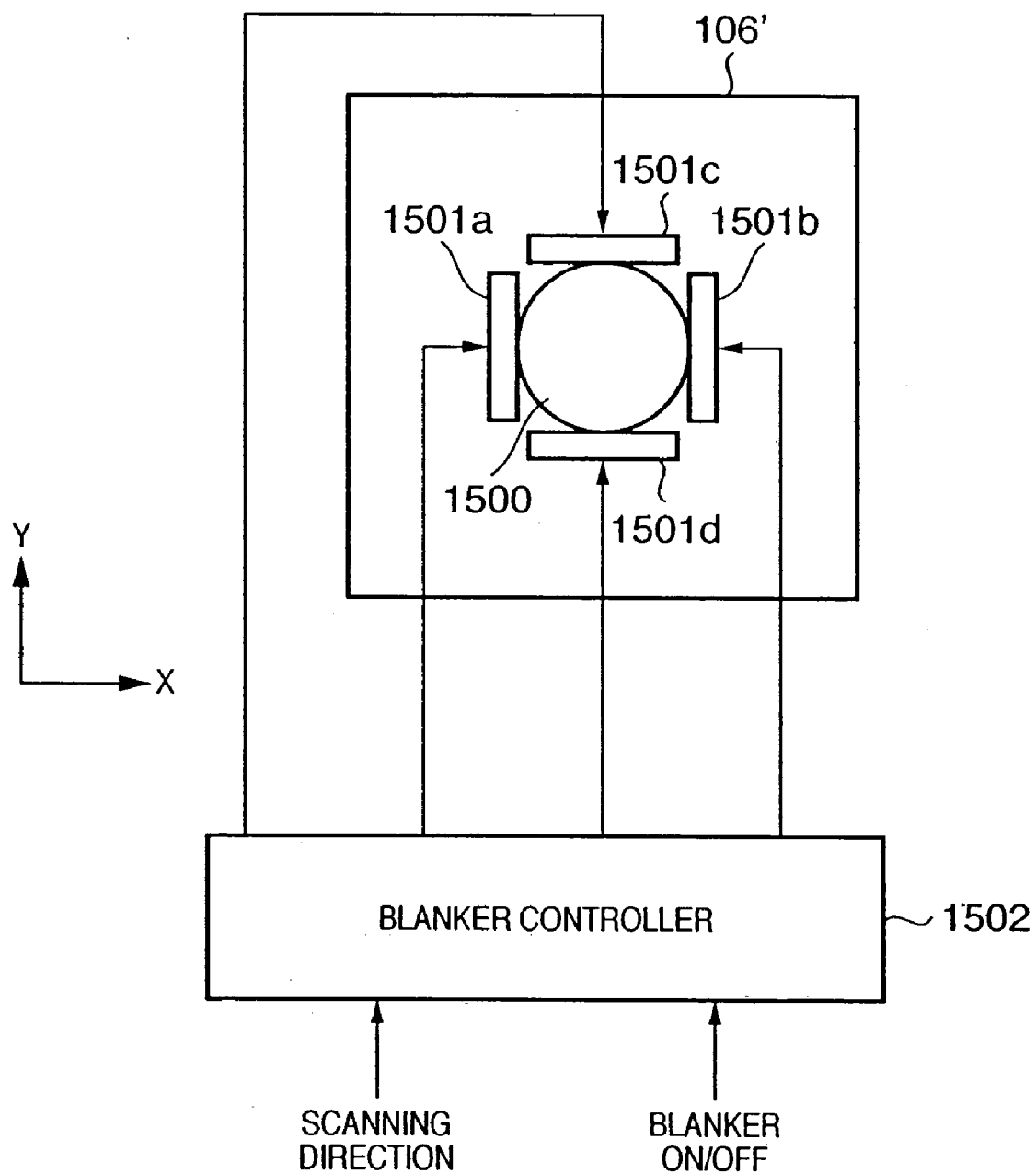
FIG. 15 is a schematic cross-sectional view of a blanker and a blanker controller according to the second embodiment.

In the first embodiment, a blanker 106' as shown in FIG. 15 is provided in place of the blanker 104, as shown in FIG. 11. FIG. 15 shows the blanker 106' viewed from a direction Z. The blanker 106' has two pairs of electrodes 1501a–1501b and 1501c–1501d around an aperture 1500. When the electrodes 1501a–1501b are used, the blanking direction becomes the direction X, and when the electrodes 1501c–1501d are used, the blanking direction becomes the direction Y.

In FIG. 15, a blanker controller 1502 changes the blanking direction in accordance with a scanning direction signal indicating whether the scanning direction of the electron beam by the electrostatic deflector 107 is the direction X or the direction Y. That is, if a blanker ON is inputted when the electron beam scanning direction is the direction X, blanking using the electrodes 1501c–1501d is performed such that the blanking direction becomes the direction Y. Similarly, if a blanker ON is inputted when the electron beam scanning direction is the direction Y, blanking using the electrodes 1501a–1501b is performed such that the blanking direction becomes the direction X.

For example, the blanker controller 1502 receives the scanning direction signal indicating whether the scanning direction is the direction X or the direction Y from a drawing controller (not shown) to control the electrostatic deflector 107, and determines the blanking direction (pair of electrodes to be used) in accordance with the scanning direction signal. Then, the blanker controller 1502ON/OFF controls the blanker array in correspondence with execution/nonexecution of pixel drawing by the drawing controller.

Second Embodiment (2) An electron beam exposure apparatus which performs blanking in a direction at which a beam diameter is the shortest (single electron beam is used).

Figure 3:
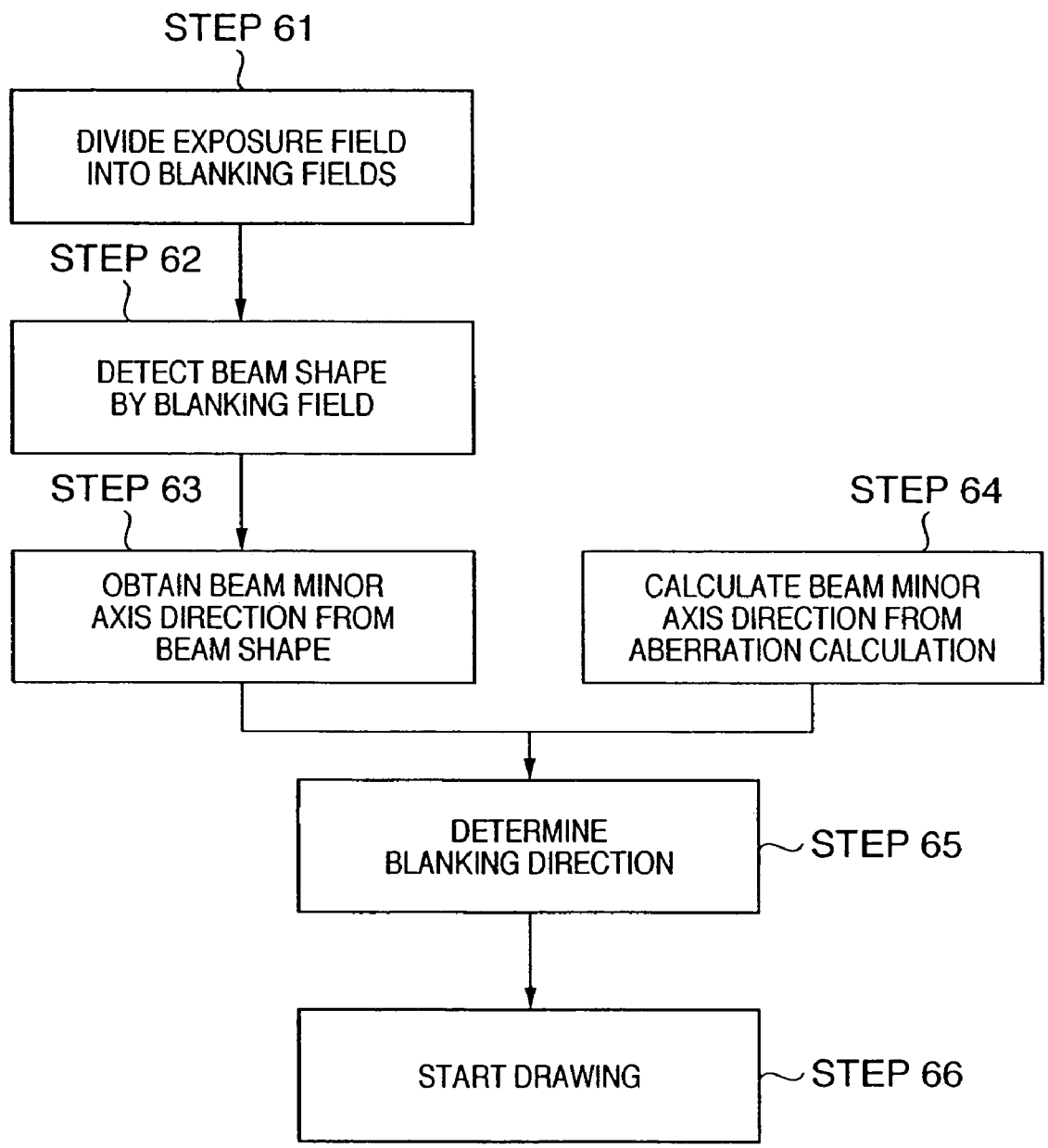
FIG. 3 is a flowchart showing blanking in a direction where a beam diameter is the shortest, in an electron beam exposure apparatus using a single electron beam, according to a second embodiment of the present invention.

Next, the operation of the electron beam exposure apparatus according to the present embodiment will be described with reference to FIG. 3.

(Step 61)

Figure 4:
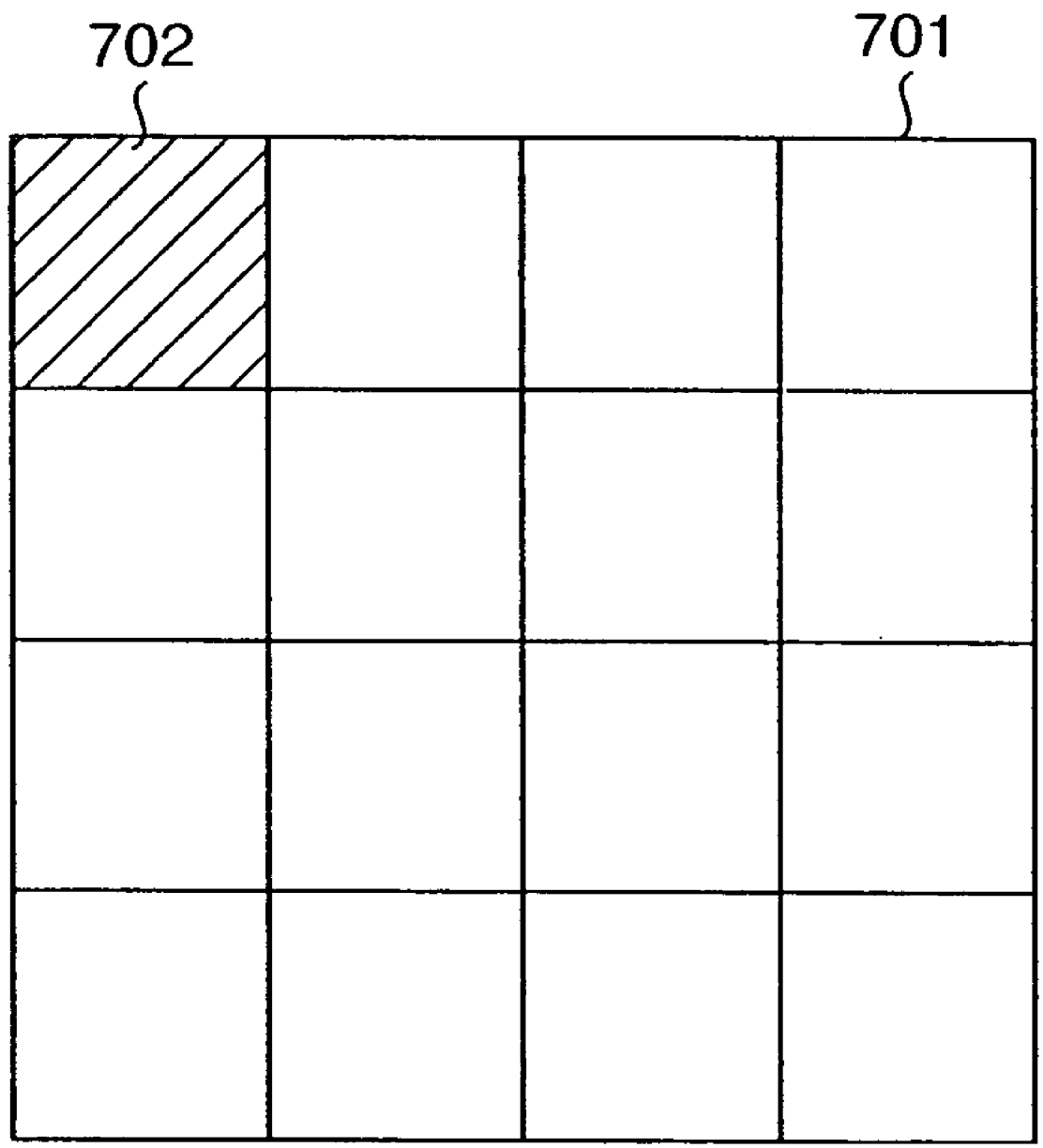
FIG. 4 is an explanatory view showing an exposure field and blanking fields according to the second embodiment.

As shown in FIG. 4, an exposure field 701 in a substrate to be exposed by using the electron beam is divided into blanking fields 702 as plural small areas. In FIG. 4, the exposure field is divided into 4×4 blanking fields. In the present embodiment, the blanking direction is set by a blanking field. The number of divided blanking fields is not limited to that of this example. Further, the shape of the blanking field is not limited to a square. When the exposure field 701 has been divided into the blanking fields 702, the process proceeds to Step 62.

(Step 62)

In each blanking field 702, the beam shape is detected in the central position or maximum deflection position. When the detection of a beam shape in all the blanking fields has been completed, the process proceeds to Step 63.

(Step 63)

In each blanking field 702, a direction in which the beam diameter becomes the shortest (beam minor axis direction) is obtained from the beam shape. When the beam minor axis direction has been obtained in each blanking field 702, the process proceeds to Step 65.

(Step 64)

Otherwise, in place of the acquisition of a beam minor axis direction by actual measurement at Steps 61 to 63, a beam shape obtained from aberration calculation can be utilized. That is, in each blanking field 702, a direction in which the beam diameter becomes the shortest is calculated from a beam diameter shape (predicted shape) previously obtained from aberration calculation, or the like. When the calculation of the beam minor axis direction in all the blanking fields 702 has been completed, the process proceeds to Step 65.

(Step 65)

Based on the beam minor axis direction obtained at Step 64 or Step 65, one of the blanking directions selectable by the blanker is selected as a direction where the beam diameter becomes the shortest, and determined as the blanking direction in the blanking field. For example, in the case of the blanker 106' in FIG. 15, one of the directions X and Y, one direction closer to the beam minor axis direction is selected as a blanking direction. Note that in FIG. 15, the blanker is capable of selecting one of two directions by two pairs of electrodes, however, it may be arranged such that the blanker is capable of selecting one of three or more directions by using three or more pairs of electrodes.

Then, a table 1601 (FIG. 16) showing the respective blanking fields and blanking directions, linked with each other, for example, is generated, and stored in a memory. Note that in an arrangement in which the blanking direction can be continuously changed, the beam minor axis direction becomes the blanking direction. When the determination of the blanking direction in all the blanking fields 702 has been completed, the process proceeds to Step 66.

(Step 66)

Upon an exposure operation, an electron-beam scanning position determination unit 1602 of a blanker controller 1600 determines a blanking field to which the electron beam is currently deflected. Then, a blanking direction acquisition unit 1603 obtains, from the table, a blanking direction corresponding to the blanking field to which the electron beam is deflected, and a blanker setting unit 1604 sets a blanking direction by the blanker. When the electron beam has been deflected to the respective blanking fields, drawing is performed while the electron beam is blanked in the blanking directions determined at Step 65.

By execution of the above operation steps, the defocus due to astigmatism aberration and/or coma aberration depending on the image height of the electron beam can be offset with the defocus of an electron beam due to blanking. Thereby, the drawing pattern dimensional accuracy can be improved.

Figure 5A:
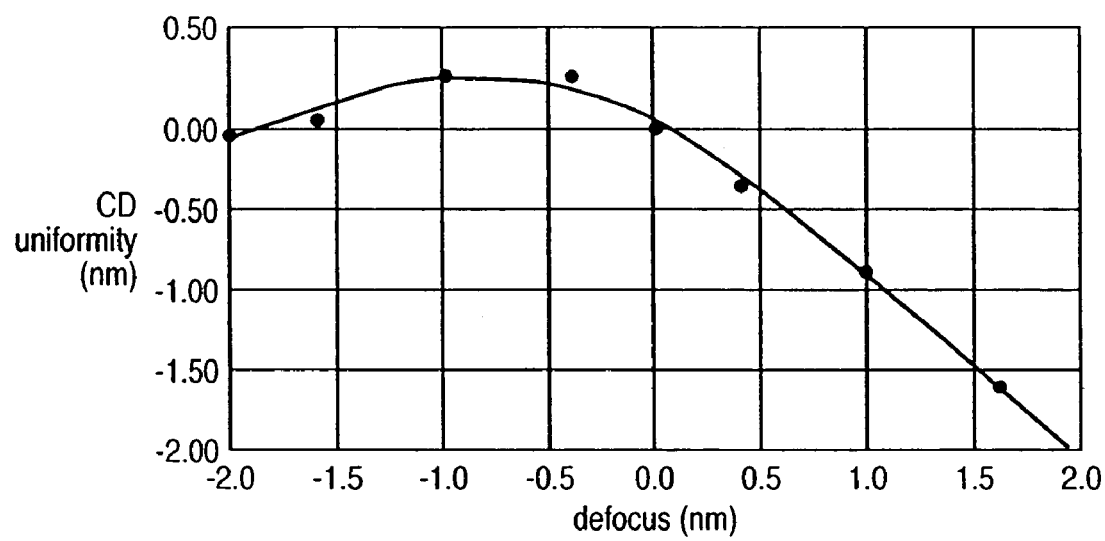
FIGS. 5A and 5B are graphs explaining that the pattern dimensional accuracy can be improved by bringing the blanking direction into correspondence with the direction where the beam diameter of an electron beam is the shortest, according to the second embodiment.
Figure 5B:
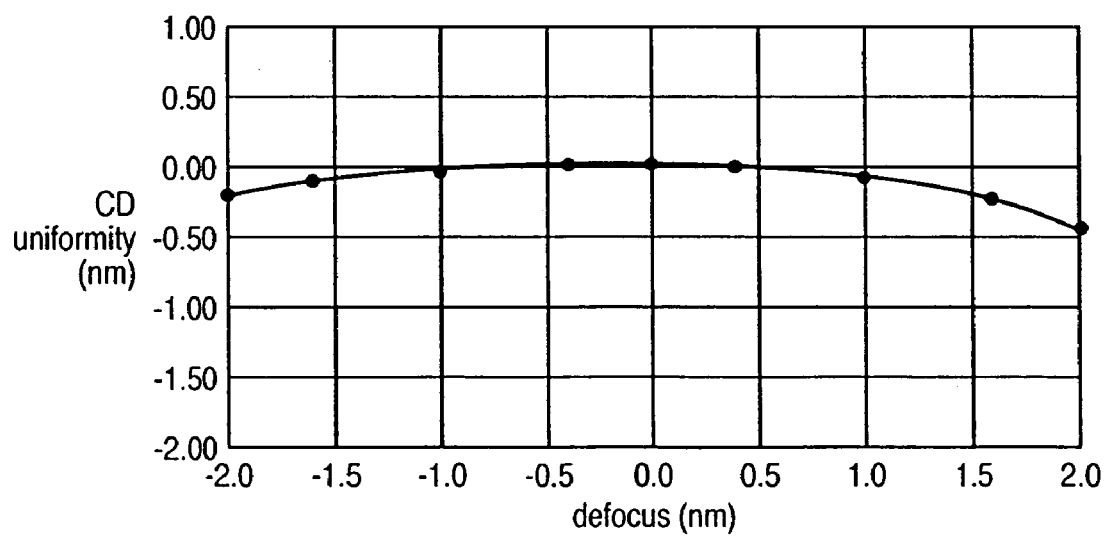

FIGS. 5A and 5B show the result of a comparison by calculation of the electron beam defocus direction and blanking direction. FIG. 5A is a graph of a pattern dimensional accuracy in a case wherein a direction in which the electron beam diameter is the longest and the blanking direction are brought into correspondence. FIG. 5B is a graph of pattern dimensional accuracy in a case wherein a direction in which the electron beam diameter is the shortest and the blanking direction are brought into correspondence.

The lateral axis indicates a focus shift amount and the vertical axis, pattern dimensional accuracy. In a case wherein there is a +2 micron focus shift, it is understood that the pattern dimensional accuracy is improved more than four times.

That is, as the electron beam exposure apparatus, which exposes a substrate using blanking means, has a function of adjusting the blanking direction to a predetermined direction as described above, the pattern dimensional accuracy can be improved.

Third Embodiment (3) An electron beam exposure apparatus which performs blanking in a direction where a beam diameter is the shortest (plural electron beams are used).

Figure 6:
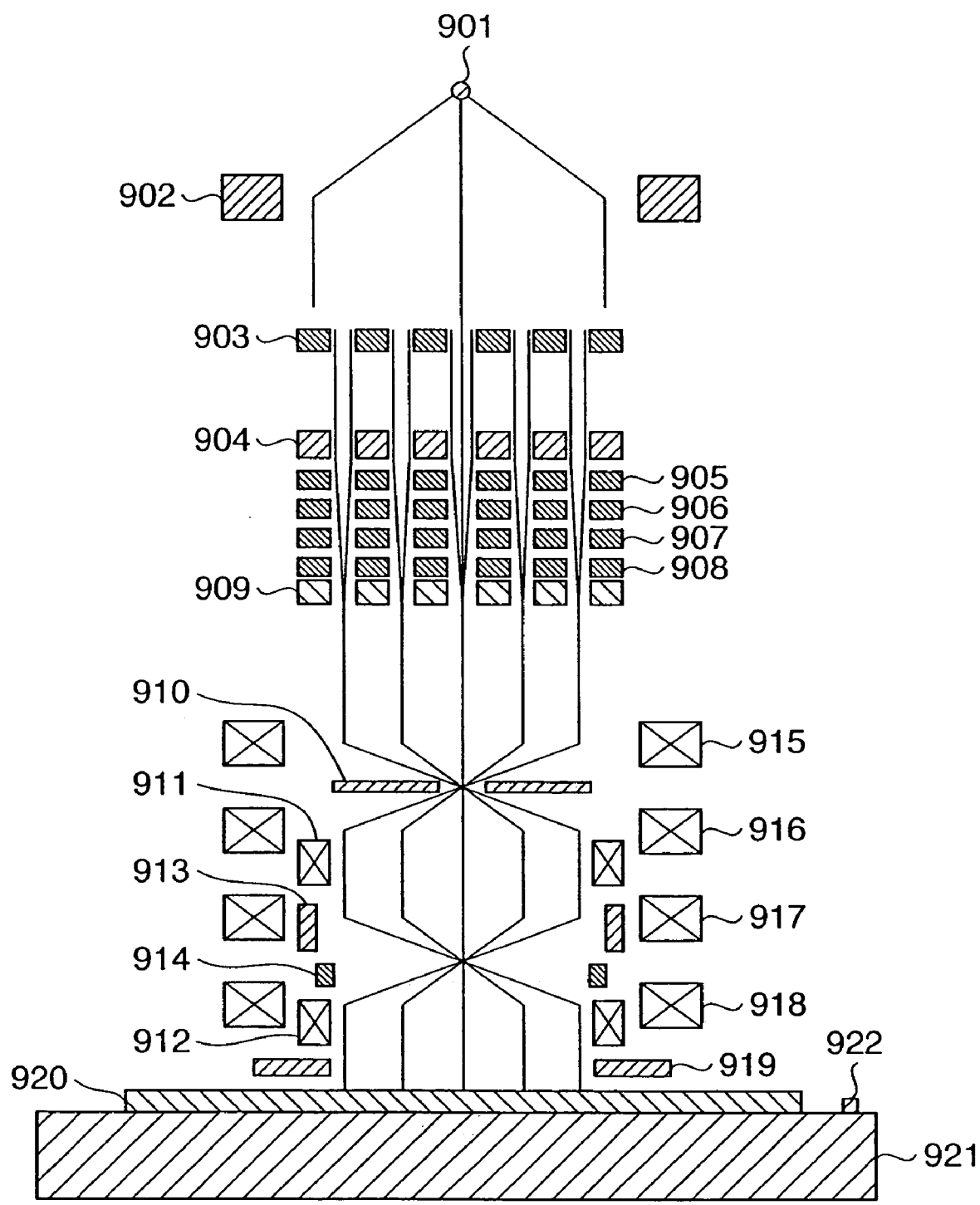
FIG. 6 is a substantial-part schematic cross-sectional view of a multi-beam type electron-beam exposure apparatus according to a third embodiment of the present invention.

FIG. 6 is a substantial-part schematic cross-sectional view of a multi-beam type electron-beam exposure apparatus according to a third embodiment of the present invention.

Numerals 901 to 909 denote multisource modules, which form plural electron source images and emit electron beams from the electron source images. In FIG. 6, 5×5 (25) multisource modules are arranged in a two-dimensional array. Numeral 901 denotes an electron source (crossover image) formed by electron guns. An electron beam emitted from the electron source 901 becomes an approximately collimated electron beam via a condenser lens 902. Numeral 903 denotes an aperture array formed with a two-dimensional array of apertures, 904, a lens array formed with a two-dimensional array of electrostatic lenses having the same optical power, 905 to 908, multi-deflector arrays respectively formed with a two-dimensional array of individually-driven electrostatic deflectors, and 909, a blanker array formed with a two-dimensional array of individually-driven electrostatic blankers. Each blanker of the blanker array 909, having two or more pairs of electrodes, provides two or more blanking directions. Further, the blanking direction can be independently set by the blanker.

Figure 7:
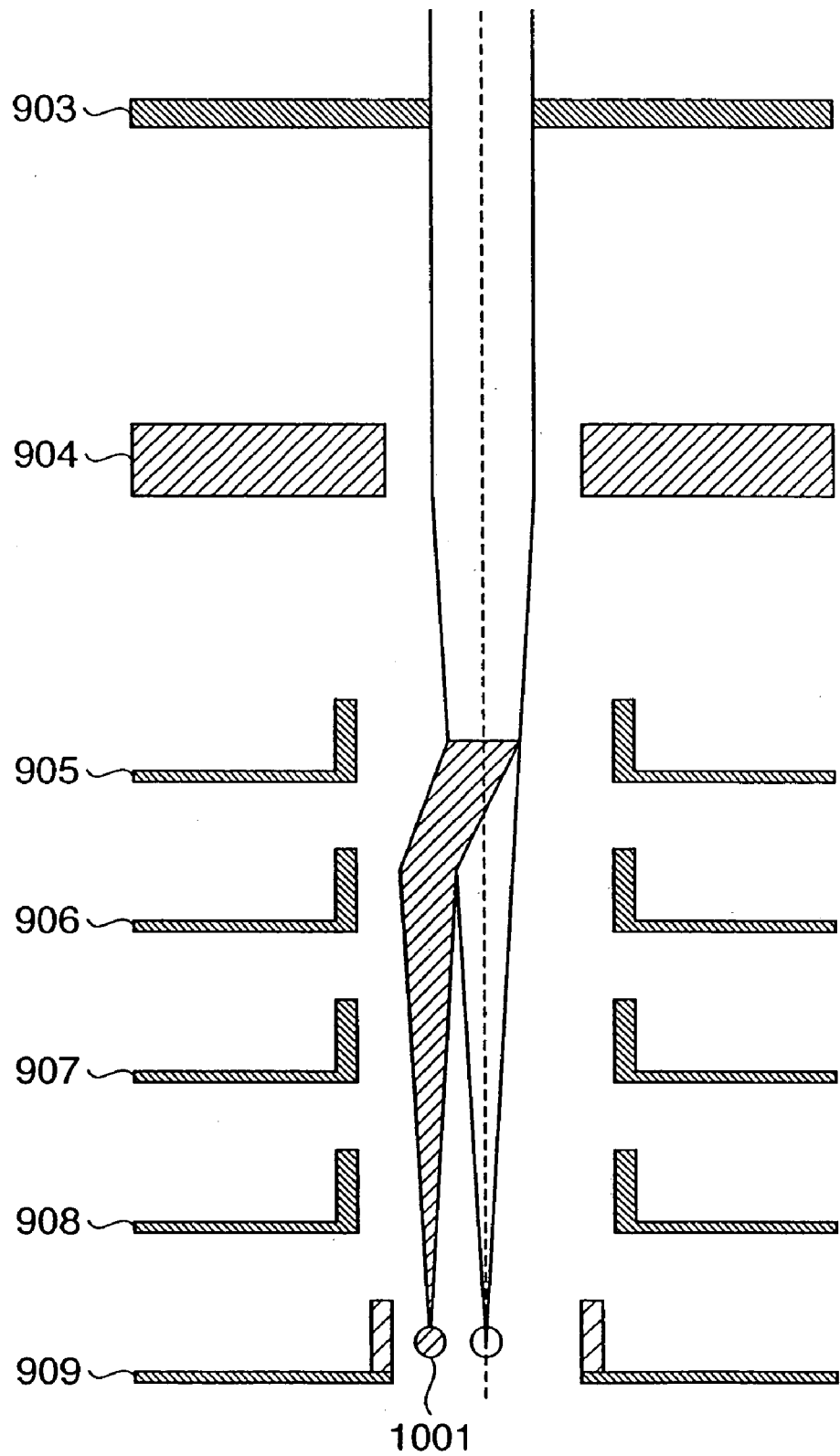
FIG. 7 is a partial expanded view of the arrangement in FIG. 6, explaining the function of multi-source modules.

Next, the respective functions will be described with reference to FIG. 7. The approximately collimated electron beam from the condenser lens 902 is divided by the aperture array 903 into plural electron beams. The divided electron beams form intermediate images 1001 of the electron source 901 on corresponding blankers of the blanker array 909 via corresponding electrostatic lenses of the lens array 904. At this time, the multi deflector arrays 905 to 908 individually adjust positions (positions in a surface vertical to a light axis) of the electron-source intermediate images 1001 formed on the blanker array 909. Further, as the electron beams deflected by the blanker array 909 are blocked by the blanking aperture 910 in FIG. 6, the beams are not emitted on the wafer 920. On the other hand, as the electron beam(s) not deflected by the blanker array 909 is not blocked by the blanking aperture 910 in FIG. 6, it is passed on to the wafer 920.

Returning to FIG. 6, the plural electron-source intermediate images formed by the multisource modules are projected on the wafer 920 via the reduced electron optical system comprising magnetic lenses 915 to 918. When the plural intermediate images are projected on the wafer 920, the focus positions can be adjusted by dynamic focus lenses (electrostatic or magnetic lenses) 911 and 912. Numerals 913 and 914 denote a main deflector and a sub-deflector to deflect the respective electron beams to positions for exposure, 919, a reflection electron detector to measure the position of the respective electron-source intermediate images formed on the wafer 920, 921, a stage to move the wafer, and 922, a mark for detection of a position of an electron beam and a beam shape.

Figure 8:
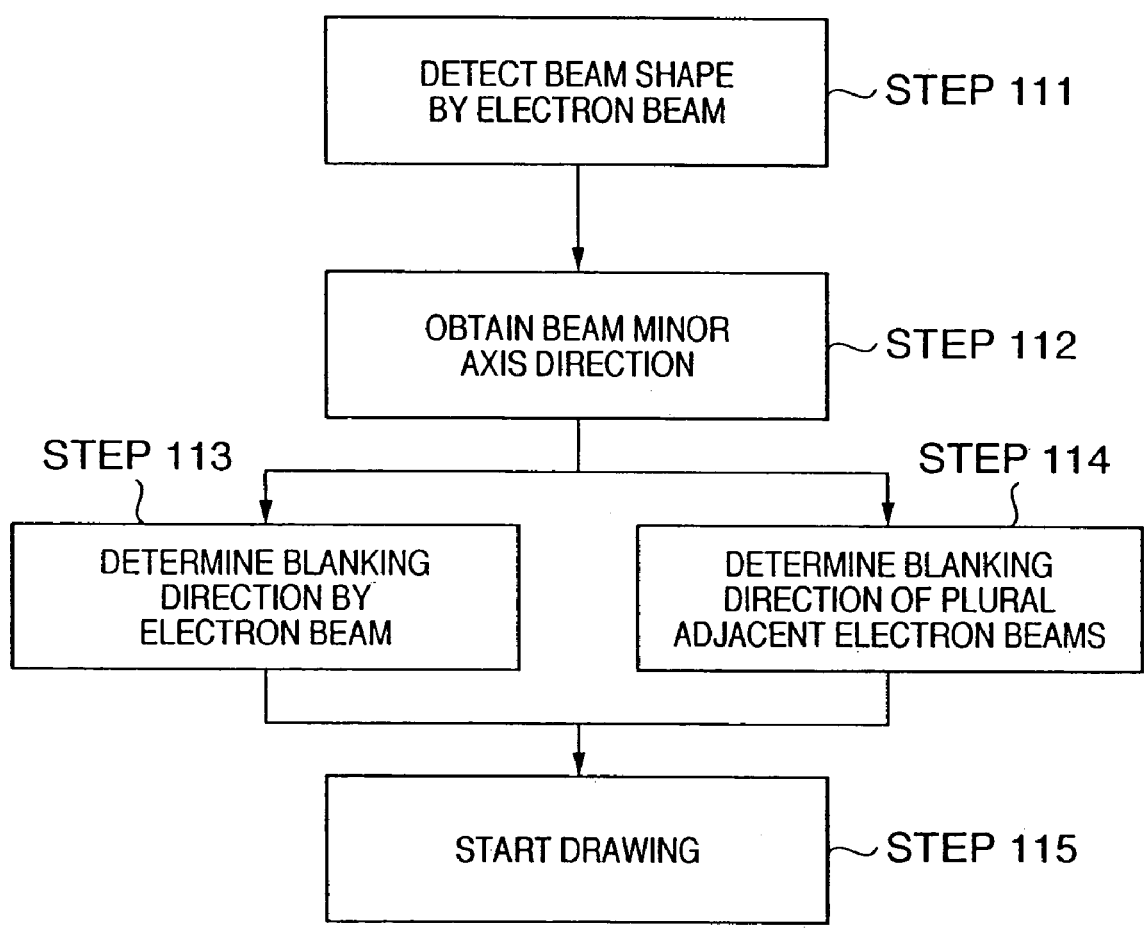
FIG. 8 is a flowchart showing the blanking in the direction where the beam diameter of an electron beam is the shortest, in the electron beam exposure apparatus using plural electron beams shown in FIG. 6.

Next, the operation of the electron beam exposure apparatus of the present invention will be described with reference to FIG. 8.

(Step 111)

The beam shape of each of the plural electron beams is detected. When the detection of the beam shape in all the electron beams has been completed, the process proceeds to Step 112.

(Step 112)

A direction in which the beam diameter is the shortest (beam minor axis direction) is obtained from each beam shape. When the beam minor axis directions of all the electron beams have been obtained, the process proceeds to Step 113 or Step 114.

(Step 113)

The direction in which the beam diameter is the shortest is determined as a blanking direction by each electron beam. When the blanking direction by each electron beam has been determined, the process proceeds to Step 115.

(Step 114)

In place of Step 113, the blanking directions for the respective blankers may be determined by the following method at Step 114. A direction in which the beam diameter of an electron beam, in the central position of predetermined plural adjacent electron beams or maximum off-axis position, is the shortest, is determined as a blanking direction of the adjacent plural electron beams. That is, the blanking direction is determined by an electron beam group including adjacent plural electron beams. When the blanking direction of the adjacent plural electron beams has been determined, the process proceeds to Step 115.

(Step 115)

The respective blankers are set so as to blank the electron beams in the blanking directions determined at Step 113 or Step 114, and drawing is performed.

Figure 16:
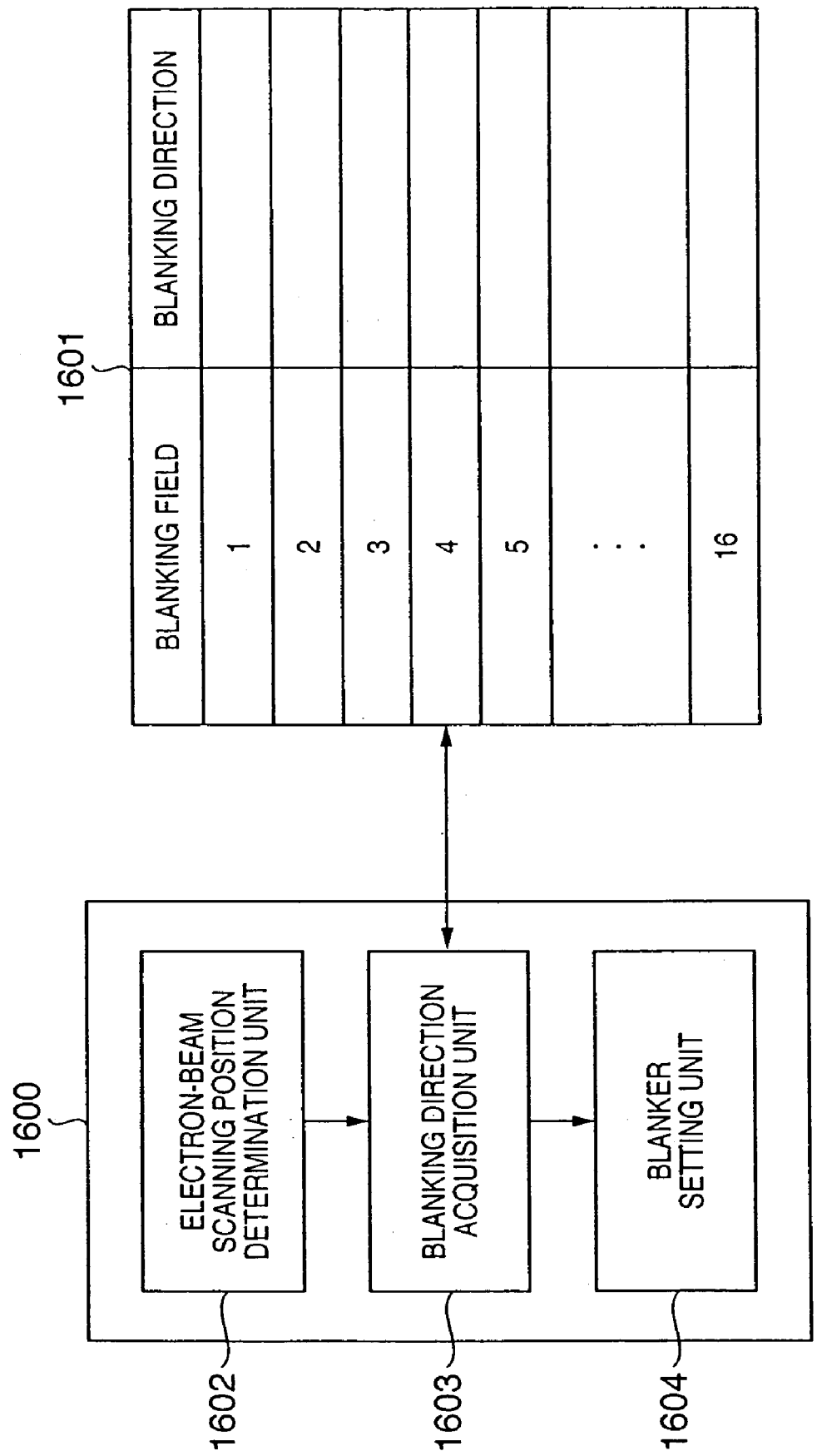
FIG. 16 is an explanatory view showing the construction of the blanker controller according to the third embodiment.

Note that, as in the case of the second embodiment, it may be arranged such that blanking fields are set and the blanking direction of the blanker is set by the blanking field. In this case, the table as shown in FIG. 16 is provided for each blanker.

By execution of the above operation steps, the defocus of the electron beams and that due to blanking can be offset, and the pattern dimensional accuracy upon drawing by plural electron beams can be improved. That is, as the electron beam exposure apparatus, which exposes a substrate using blanking means, has a function of adjusting the blanking direction to a predetermined direction, as described above, the pattern dimensional accuracy can be improved.

Note that, in the above-described first, second and third embodiments, it is preferable that the deflector as a blanker has plural pairs of deflection electrodes such that the charged particle beam can be deflected in 360° directions around the optical axis.

Figure 14:
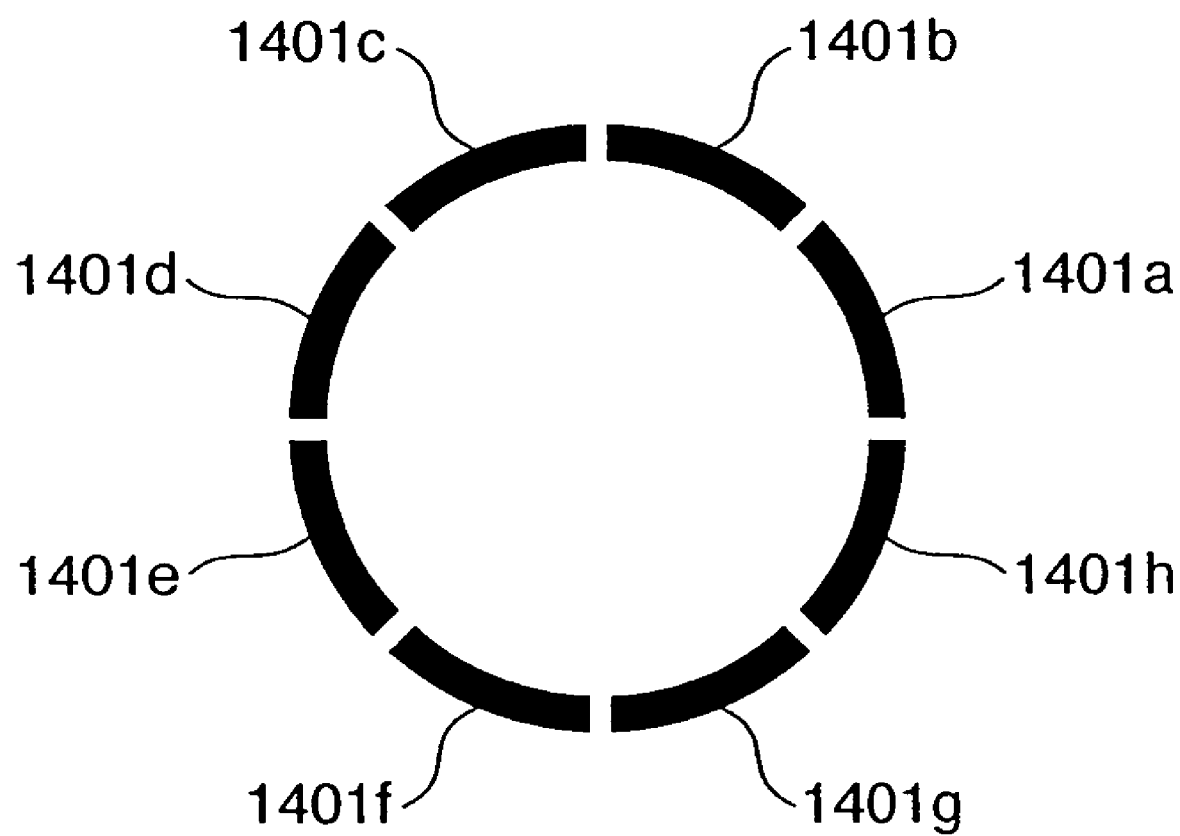
FIG. 14 is a top plan view of an eight-pole deflector.

As an example, FIG. 14 shows a top plan view of an eight-pole deflector.

In this eight-pole deflector, deflection can be made in an arbitrary one of all 360° directions.

For example, in a case wherein an electron beam is to be deflected to a positive side of the direction Y, voltages (1401a)($\sqrt{2}-1$)Vy, (1401b)Vy, (1401c)Vy, (1401d)($\sqrt{2}-1$)Vy, (1401e)–($\sqrt{2}-1$)Vy, (1401f)–Vy, (1401g)–Vy, and (1401h)–($\sqrt{2}-1$)Vy, are applied to the eight-pole electrodes 1401a to 1401h. Note that Vy is an arbitrary voltage.

The electron beam is deflected in an arbitrary direction by superimposing a voltage Vx which deflects the electron beam in the X direction and a voltage Vy which deflects the electron beam in the Y direction.

More specifically, voltages (1401a)Vx+($\sqrt{2}-1$)Vy, (1401b)($\sqrt{2}-1$)Vx+Vy, (1401c)–($\sqrt{2}-1$)Vx+Vy, (1401d)–Vx+($\sqrt{2}-1$)Vy, (1401e)–Vx–($\sqrt{2}-1$)Vy, (1401f)–($\sqrt{2}-1$)Vx–Vy, (1401g) ($\sqrt{2}-1$)Vx–Vy, and (1401h)Vx–($\sqrt{2}-1$)Vy, are applied to the eight-pole electrodes 1401a to 1401h.

The blanker used for blanking may have a twelve-pole deflector or a twenty-pole deflector. The twelve-pole deflector and the twenty-pole deflector can also deflect the electron beam in an arbitrary direction as the eight-pole deflector.

Further, the present invention is applicable to even a deflector having only one pair of deflection electrodes, which deflects a charged particle beam in only one linear direction vertical to the optical axis. In this case, the blanking direction is adjusted by rotating the blanker about the optical axis. Otherwise, the number of blanking directions may be increased by providing a pair of deflection electrodes in multiple steps in the optical axis direction. Further, in a case wherein plural beams are used, the blanker may be rotated by 90° about the optical axis. Further, in an apparatus which performs raster scanning, the scanning direction of a charged particle beam and the direction of a substrate may be adjusted in accordance with necessity.

Fourth Embodiment

Next, an example of the production of a device utilizing the above-described electron-beam exposure apparatus will be described.

Figure 9:
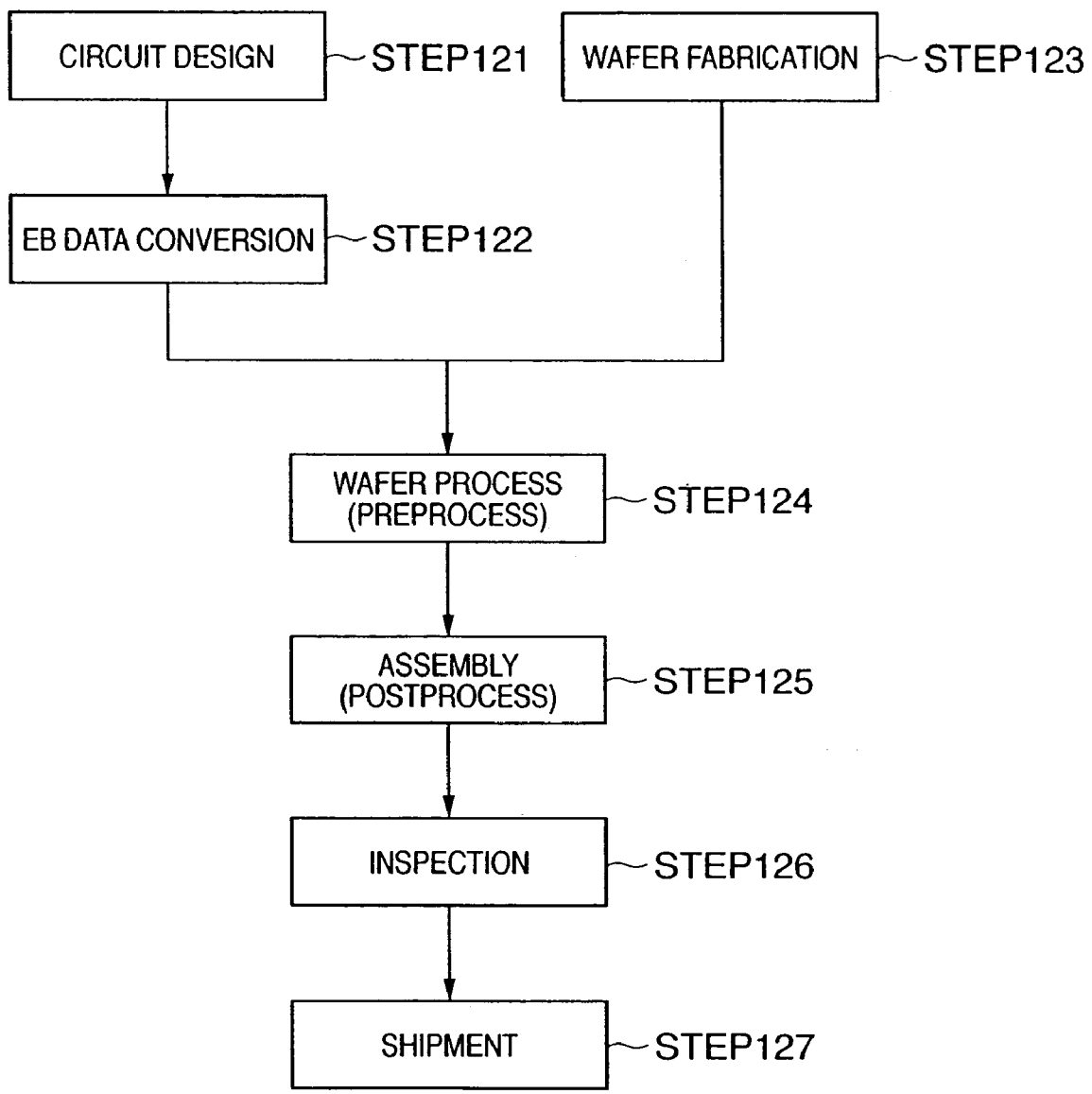
FIG. 9 is a flowchart showing microdevice fabrication according to the third embodiment.

FIG. 9 shows a microdevice (e.g., a semiconductor chip, such as an IC or LSI, a liquid crystal panel, a CCD, a thin-film magnetic head, a micromachine, or the like) fabrication flow. At step 121 (circuit designing), a semiconductor device circuit pattern is designed. At step 122 (EB data conversion), exposure control data for the exposure apparatus is generated based on the designed circuit pattern. On the other hand, at step 123 (wafer fabrication), a wafer is fabricated by using a material, such as silicon. At step 124 (wafer process), called a preprocess, an actual circuit is formed on the wafer by a lithography technique using the exposure apparatus where the above exposure control data is inputted. At the next step, step 125 (assembly), called a postprocess, a semiconductor chip is fabricated by using the wafer carrying the circuit formed at step 124. Step 125 includes an assembly process (dicing and bonding), a packaging process (chip encapsulation), and the like. At step 126 (inspection), inspections such as an operation check, a durability test, and the like, are performed on the semiconductor device formed at step 125. The semiconductor device is completed through these processes, and is shipped (step 127).

Figure 10:
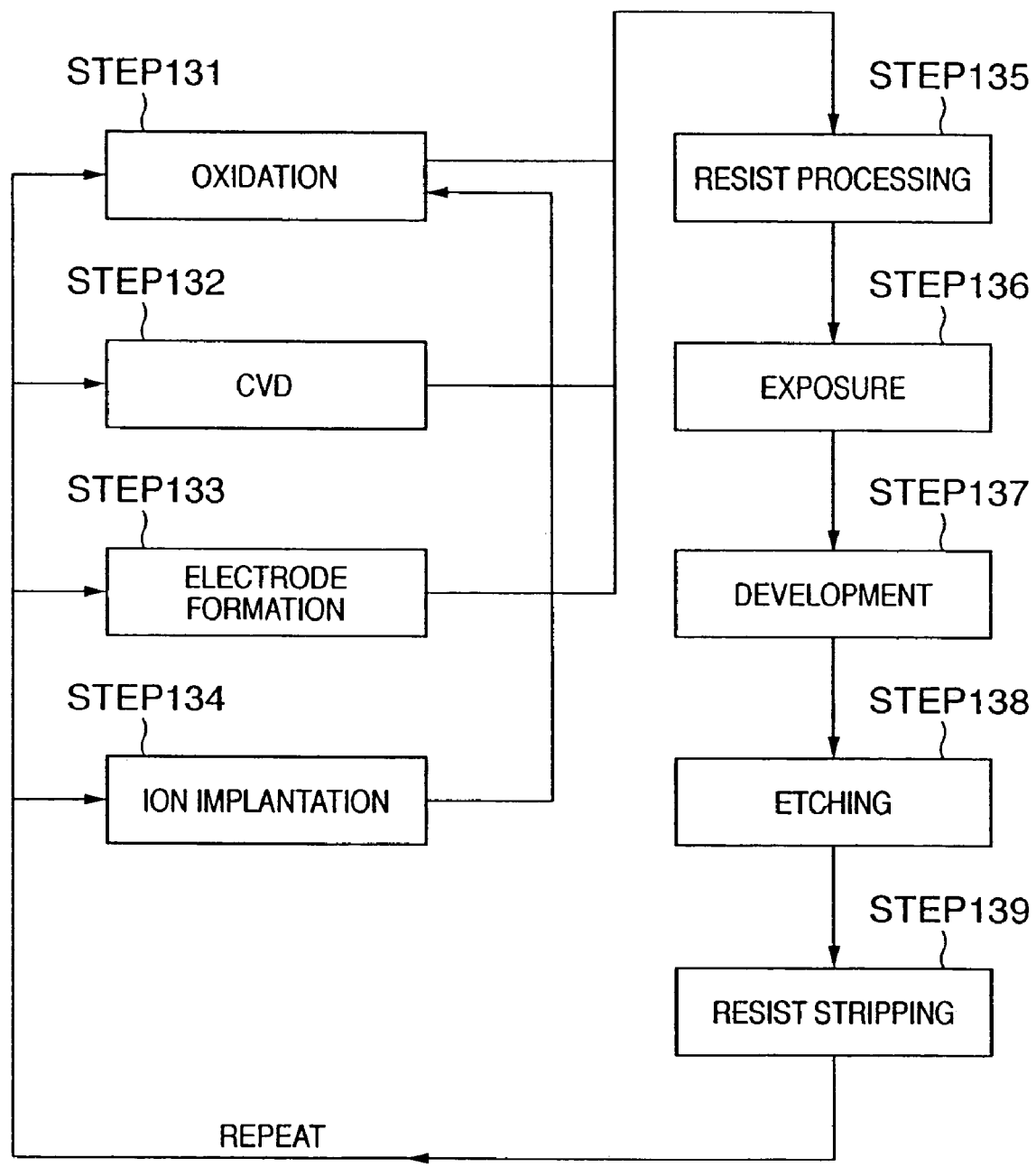
FIG. 10 is a flowchart showing a wafer process in FIG. 9.

FIG. 10 shows the detailed flow of the wafer process. At step 131 (oxidation), the surface of the wafer is oxidized. At step 132 (CVD), an insulating film is formed on the surface of the wafer. At step 133 (electrode formation), electrodes are formed by vapor deposition on the wafer. At step 134 (ion implantation), ions are injected in the wafer. At step 135 (resist processing), the wafer is coated with photoresist. At step 136 (exposure), the mask circuit pattern is exposure-printed on the wafer by the above-described exposure apparatus or method. At step 137 (development), the exposed wafer is developed. At step 318 (etching), portions other than the developed resist are removed. At step 139 (resist stripping), the resist, which is unnecessary after the completion of etching, is removed. These steps are repeated, to form multiple layers of circuit patterns on the wafer. By using the fabrication method of the present embodiment, a highly-integrated semiconductor device can be manufactured with excellent pattern dimensional accuracy.

According to the present invention, a charged particle exposure apparatus and an exposure method with excellent pattern dimensional accuracy can be provided. Further, by using the apparatus or method, a device with higher precision can be manufactured, in comparison with devices manufactured by the conventional techniques.

The present invention is not limited to the above embodiments and various changes and modifications can be made within the spirit and scope of the present invention. Therefore, to apprise the public of the scope of the present invention, the following claims are made.

CLAIM OF PRIORITY

This application claims priority from Japanese Patent Application No. 2004-194775 filed on Jun. 30, 2004, which is hereby incorporated by reference herein.

What is claimed is:

1. A charged particle beam exposure apparatus for writing a desired pattern on a substrate using a charged particle beam, said apparatus comprising:
   a blanking unit, having a deflector capable of deflecting the charged particle beam in at least two directions, configured to control beam passage to the substrate by deflecting the charged particle beam; and
   a setting unit configured to set a deflection direction of the charged particle beam by the deflector.

2. The apparatus according to claim 1, wherein said blanking unit has an aperture to pass the charged particle beam,
   and wherein said deflector deflects the charged particle beam in at least two directions by at least two pairs of electrodes provided around the aperture.

3. The apparatus according to claim 1, wherein said blanking unit has a deflector having an aperture to pass the charged particle beam and at least a pair of electrodes provided with the aperture therebetween, and said unit is rotatable about an optical axis.

4. The apparatus according to claim 1, wherein said blanking unit has an aperture to pass the charged particle beam,
   and wherein said deflector has at least four pairs of electrodes provided around the aperture, and deflects the charged particle beam in at least four directions.

5. The apparatus according to claim 1, further comprising a scanning unit configured to relatively scan the charged particle beam to the substrate,
   wherein said setting unit sets the deflection direction of the charged particle beam by the deflector based on a scanning direction of the charged particle beam.

6. The apparatus according to claim 5, wherein said setting unit sets the deflection direction of the charged particle beam to a direction approximately vertical to the scanning direction of the charged particle beam.

7. The apparatus according to claim 1, wherein said setting unit sets the deflection direction of the charged particle beam based on a beam shape of the charged particle beam on the substrate.

8. The apparatus according to claim 7, wherein said setting unit divides an exposure area on the substrate into plural partial areas, and sets the deflection direction for said deflector based on the beam shape of the charged particle beam, by the plural partial areas.

9. The apparatus according to claim 7, wherein said setting unit sets the deflection direction of the charged particle beam to a direction where a beam diameter of sad the charged particle beam is the shortest on the substrate.

10. A charged particle beam exposure apparatus for printing a desired pattern on a substrate using plural charged particle beams, said apparatus comprising:
    a blanking array unit, having plural deflectors provided in correspondence with the respective charged particle beams, to deflect the charged particle beam into at least two directions, configured to control beam passage to the substrate by respectively deflecting the plural charged particle beams; and
    a setting unit configured to set a respective deflection direction of a charged particle beam for the plural deflectors.

11. The apparatus according to claim 10, wherein, regarding each of the plural charged particle beams, said setting unit sets the deflection direction for a corresponding deflector based on a beam shape of charged a particle beam on the substrate.

12. The apparatus according to claim 10, wherein said setting unit divides an exposure area on the substrate into plural partial areas, and sets the deflection direction for each said deflector by the plural partial areas.

13. The apparatus according to claim 10, wherein said setting unit sets the deflection direction of the charged particle beam to a direction where a beam diameter of the charged particle beam is the shortest on the substrate.

14. A charged particle beam exposure method for writing a desired pattern on a substrate using a charged particle beam, said method comprising:
    a step of dividing an exposure area on the substrate into plural partial areas;
    a step of detecting a beam shape for each partial area;

a step of obtaining a beam minor axis direction from the detected beam shape, on each partial area, prior to an actual writing exposure; and a step of controlling beam passage to the substrate by deflecting the charged particle beam in the obtained beam minor axis direction, for each partial area.

15. A charged particle beam exposure method for printing a desired pattern on a substrate using plural charged particle beams, said method comprising:

a step of detecting a beam shape of each of the plural charged particle beams;

a step of obtaining a beam minor axis direction from the detected beam shape, for each of the plural charged particle beams, prior to an actual writing exposure; and a step of controlling beam passage to the substrate by deflecting the plural charged particle beams in the respectively obtained beam minor axis directions.

16. A device fabrication method comprising:

a step of exposing a substrate using the charged particle beam exposure apparatus according to claim 1; and a step of developing the substrate.

17. A device fabrication method comprising:

a step of exposing a substrate using the charged particle beam exposure apparatus according to claim 10; and a step of developing the substrate.

* * * * *